US012660422B2

(12) United States Patent
Jung et al.

(10) Patent No.: US 12,660,422 B2
(45) Date of Patent: Jun. 16, 2026

(54) DISPLAY DEVICE HAVING SPACERS AND MANUFACTURING METHOD THEREOF

(71) Applicant: Samsung Display Co., Ltd., Yongin-Si (KR)

(72) Inventors: Soo-Young Jung, Hwaseong-si (KR); Sung Jae Jung, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 931 days.

(21) Appl. No.: 17/873,942

(22) Filed: Jul. 26, 2022

(65) Prior Publication Data

US 2023/0157083 A1     May 18, 2023

(30) Foreign Application Priority Data

Nov. 16, 2021     (KR) ........................ 10-2021-0157478

(51) Int. Cl.
H10K 59/122 (2023.01)
H10K 59/12 (2023.01)
H10K 71/00 (2023.01)

(52) U.S. Cl.
CPC ........... H10K 59/122 (2023.02); H10K 71/00 (2023.02); H10K 59/1201 (2023.02)

(58) Field of Classification Search
CPC .. H10K 59/122; H10K 71/00; H10K 59/1201; H10K 59/121; H10K 59/353; H10K 71/135; H10K 50/841; H10K 59/30; H10K 59/131; H10K 50/844; H10K 50/865; H10K 59/40; H10K 59/873; H10K 50/805; H10K 59/124; H10K 50/84; G06F 3/0412; G06F 3/041

See application file for complete search history.

(56) References Cited

U.S. PATENT DOCUMENTS

| | | | | |
|---|---|---|---|---|
| 6,597,427 B1 * | 7/2003 | Katsu | ................ | G02F 1/136259 |
| | | | | 349/54 |
| 7,023,234 B2 * | 4/2006 | Tomita | ................... | G09G 3/006 |
| | | | | 324/760.02 |

(Continued)

FOREIGN PATENT DOCUMENTS

| | | |
|---|---|---|
| CN | 110993661 A | 4/2020 |
| CN | 111799320 A | 10/2020 |

(Continued)

*Primary Examiner* — Caleb E Henry
(74) *Attorney, Agent, or Firm* — Innovation Counsel LLP

(57)     ABSTRACT

A display device includes: a substrate; an insulation layer that is positioned on the substrate and includes a plurality of openings; a plurality of emission layers that are positioned in the openings; and a plurality of spacers that are positioned on the insulation layer, wherein an area where the emission layers are positioned defines light emitting regions on a plane, at least one of the spacers has a shape of a circle, a regular polygon having five or more sides, or a regular polygon with at least one rounded corner and five or more sides, a planar area of at least one of the spacers is larger than a planar area of the smallest light emitting region, and the number of the spacers positioned in the predetermined region is at least 30% of the number of the light emitting regions arranged in the predetermined region.

19 Claims, 19 Drawing Sheets

(56) References Cited

U.S. PATENT DOCUMENTS

| | | | | |
|---|---|---|---|---|
| 8,508,123 | B2 * | 8/2013 | Nakamura | G02F 1/1309 |
| | | | | 345/55 |
| 9,287,329 | B1 * | 3/2016 | Lee | H10K 59/131 |
| 10,452,098 | B2 | 10/2019 | Jang et al. | |
| 10,678,368 | B2 * | 6/2020 | Gwon | G06F 3/0412 |
| 10,838,261 | B2 * | 11/2020 | Mibu | G02F 1/134309 |
| 10,971,571 | B2 * | 4/2021 | Won | H10K 59/131 |
| 11,600,686 | B2 * | 3/2023 | Won | G06F 3/0443 |
| 2005/0237211 | A1 * | 10/2005 | Sato | G09G 3/3283 |
| | | | | 362/559 |
| 2010/0020029 | A1 * | 1/2010 | Park | G06F 3/0412 |
| | | | | 345/173 |
| 2013/0113734 | A1 * | 5/2013 | Cho | G06F 3/041 |
| | | | | 345/173 |
| 2014/0319479 | A1 | 10/2014 | Park et al. | |
| 2016/0351093 | A1 * | 12/2016 | Kim | H10K 59/131 |
| 2017/0154945 | A1 * | 6/2017 | Shin | G09G 3/3266 |
| 2017/0294500 | A1 * | 10/2017 | Song | H10K 59/123 |
| 2017/0372974 | A1 * | 12/2017 | Tseng | H10D 30/024 |
| 2018/0032189 | A1 * | 2/2018 | Lee | G09G 3/3233 |
| 2018/0033830 | A1 * | 2/2018 | Kim | H10K 59/873 |
| 2018/0033831 | A1 * | 2/2018 | An | H10K 59/87 |
| 2018/0090702 | A1 * | 3/2018 | Um | H10K 77/111 |
| 2018/0113545 | A1 * | 4/2018 | Shim | G06F 3/0412 |
| 2018/0226454 | A1 * | 8/2018 | Liu | H10K 59/122 |
| 2018/0226610 | A1 * | 8/2018 | Moon | H10K 59/124 |
| 2018/0348937 | A1 * | 12/2018 | Pak | G06F 3/0446 |
| 2018/0366520 | A1 * | 12/2018 | Gwon | G06F 3/0443 |
| 2018/0373372 | A1 * | 12/2018 | Kim | G06F 3/0445 |
| 2019/0004653 | A1 * | 1/2019 | Won | H10K 59/40 |
| 2019/0004654 | A1 * | 1/2019 | Gwon | H10K 59/131 |
| 2019/0006431 | A1 * | 1/2019 | Won | G06F 3/0446 |
| 2019/0036063 | A1 * | 1/2019 | Lee | G06F 3/0443 |
| 2019/0129550 | A1 * | 5/2019 | Jang | G06F 3/0445 |
| 2019/0131379 | A1 * | 5/2019 | Won | G06F 3/0443 |
| 2019/0131572 | A1 * | 5/2019 | Gwon | G06F 3/0412 |
| 2019/0187850 | A1 * | 6/2019 | Kim | G06F 1/1643 |
| 2019/0293984 | A1 * | 9/2019 | Chen | G02F 1/13394 |
| 2019/0302934 | A1 * | 10/2019 | Rhe | G06F 3/047 |
| 2019/0302943 | A1 * | 10/2019 | Rhe | G06F 3/047 |
| 2019/0302944 | A1 * | 10/2019 | Rhe | G06F 3/0445 |
| 2019/0310731 | A1 * | 10/2019 | Rhe | G06F 3/047 |
| 2019/0339818 | A1 * | 11/2019 | Rhe | G06F 3/0443 |
| 2020/0026383 | A1 * | 1/2020 | Hwang | G06F 3/04184 |
| 2020/0026385 | A1 * | 1/2020 | Lee | G06F 3/0416 |
| 2020/0026408 | A1 * | 1/2020 | Lee | G06F 3/04184 |
| 2020/0167038 | A1 * | 5/2020 | Lee | G06F 3/0443 |
| 2020/0251528 | A1 | 8/2020 | Lee | |
| 2020/0301196 | A1 * | 9/2020 | Gao | G02F 1/1337 |
| 2021/0193787 | A1 * | 6/2021 | Won | G06F 3/04164 |
| 2022/0013603 | A1 | 1/2022 | Kim et al. | |
| 2022/0069027 | A1 | 3/2022 | Wang et al. | |
| 2022/0130915 | A1 | 4/2022 | Son et al. | |
| 2022/0256719 | A1 * | 8/2022 | Jang | G06F 1/1652 |
| 2022/0310721 | A1 | 9/2022 | Ma et al. | |

FOREIGN PATENT DOCUMENTS

| | | |
|---|---|---|
| KR | 10-2007-0029007 A | 3/2007 |
| KR | 10-1427593 B1 | 8/2014 |
| KR | 10-2016-0094588 A | 8/2016 |
| KR | 10-2017-0104085 A | 9/2017 |
| KR | 10-2019-0098894 A | 8/2019 |
| KR | 10-2020-0096357 A | 8/2020 |
| KR | 10-2015-0084573 A | 1/2021 |
| KR | 10-2021-0010597 A | 1/2021 |
| KR | 10-2021-0054654 A | 5/2021 |
| KR | 10-2021-0097878 A | 8/2021 |
| KR | 10-2022-0007788 A | 1/2022 |
| KR | 10-2022-0053756 A | 5/2022 |

* cited by examiner

Figures 8A, 8B, 8C, 8D, 8E:
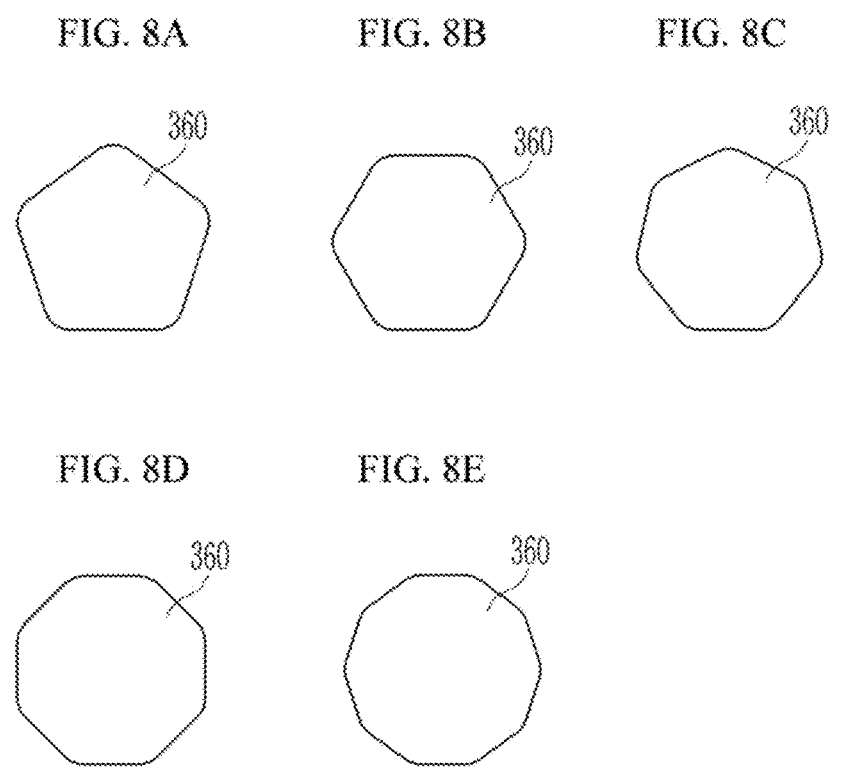

Figures 10A, 10B:
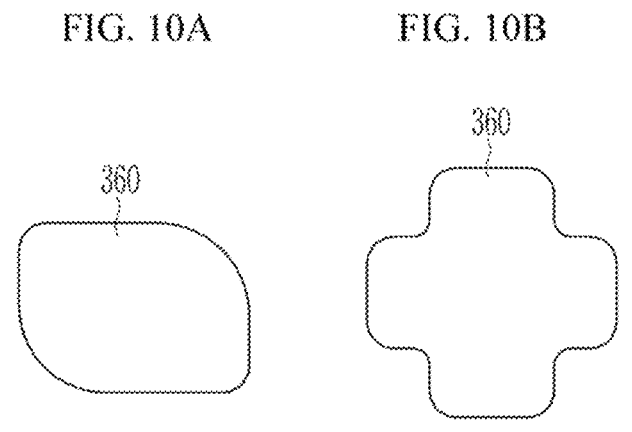

DISPLAY DEVICE HAVING SPACERS AND MANUFACTURING METHOD THEREOF

CROSS-REFERENCE TO RELATED APPLICATION

This application claims priority to and the benefit of Korean Patent Application No. 10-2021-0157478 filed in the Korean Intellectual Property Office on Nov. 16, 2021, the entire content of which is incorporated herein by reference.

BACKGROUND

(a) Technical Field

The present disclosure relates to a display device and a manufacturing method thereof.

(b) Description of the Related Art

A display device includes a display area that can display an image, wherein a plurality of pixels are positioned in the display area. Each pixel includes a display element such as a light emitting diode and a pixel circuit including a plurality of transistors and at least one capacitor for driving the display element.

The display area includes a pixel area, which is a unit that is connected to each pixel circuit and can emit light. The display area includes a plurality of pixel areas emitting light of different colors.

The light emitting diode may include two electrodes and an emission layer positioned between the two electrodes. The emission layer may be formed using a mask having an opening corresponding to each pixel area.

The display element of the display device may be protected from penetration of impurities such as external moisture and oxygen by being sealed by an encapsulation layer. The encapsulation layer includes at least one organic layer. The organic layer may be formed using an Inkjet process.

The above information disclosed in this Background section is only for enhancement of understanding of the background of the disclosure, and therefore it may contain information that does not form the prior art that is already known to a person of ordinary skill in the art.

SUMMARY

A display device including an organic layer that is evenly formed throughout a substrate by improving spreadability of a dropped ink layer in an inkjet process can be easily formed, and can increase strength against external pressure.

A display device according to an embodiment includes: a substrate; an insulation layer that is positioned on the substrate and includes a plurality of openings; a plurality of emission layers that are positioned in the openings; and a plurality of spacers that are positioned on the insulation layer, wherein an area where the plurality of emission layers are positioned defines a plurality of light emitting regions on a plane, at least one of the spacers has a shape of a circle, a regular polygon having five or more sides, or a regular polygon with at least one rounded corner and five or more sides, a planar area of at least one of the spacers is larger than a planar area of a smallest light emitting region among the plurality of light emitting regions, and a number of the plurality of the spacers positioned in a predetermined region is at least 30% of a number of the plurality of the light emitting regions arranged in the predetermined region.

A width of the plurality of spacers in a first direction may be 50% or more of a distance between two light emitting regions that are neighboring in the first direction.

A width of the plurality of spacers in a second direction that is perpendicular to the first direction may be 50% or more of the distance between two light emitting regions that are neighbored in the second direction.

The plurality of spacers may be disposed at a preset interval in at least one of the first direction and the second direction.

One spacer may be positioned between two light emitting regions that neighbor each other in one direction.

The spacer includes a plurality of sub-spacers that are spaced apart from each other.

A planar shape of the sub-spacer may include one of a circle, a regular polygon having five or more sides, and a regular polygon with at least one rounded corner and five or more sides.

The plurality of light emitting regions may be arranged in a first direction and a second direction, and one spacer may be positioned for no more than two of the plurality of light emitting regions arranged in the first direction, and one spacer may be positioned for no more than two of the plurality of light emitting regions arranged in the second direction.

The insulation layer and the spacer may include a same material.

The insulation layer and the spacer may include different materials.

The display device may further include: a pixel electrode that is positioned between the substrate and the insulation layer; and a common electrode that is positioned on the emission layer, wherein the pixel electrode, the emission layer, and the common electrode may form a light emitting diode.

The display device may further include an organic layer that is positioned on the light emitting diode and coated on an entire surface of the substrate.

A display device according to an embodiment includes: a substrate; an insulation layer that is positioned on the substrate and includes a plurality of openings; a plurality of emission layers that are positioned in the opening; and a plurality of spacers that are positioned on the insulation layer, wherein an area where the plurality of emission layers are positioned defines a plurality of light emitting regions on a plane, at least one of the spacers has a shape of a circle, a regular polygon having five or more sides, or a regular polygon with at least one rounded corner and five or more sides, and a number of the plurality of the spacers positioned in a predetermined region is at least 30% of a number of the plurality of the light emitting regions arranged in the predetermined region.

A width of the plurality of spacers in a first direction may be 50% or more of a distance between two light emitting regions that are neighboring in the first direction.

A width of the plurality of spacers in a second direction that is perpendicular to the first direction may be 50% or more of a distance between two light emitting regions that are neighbored in the second direction.

The plurality of spacers may be disposed at a preset interval in at least one of the first direction and the second direction.

The spacer may include a plurality of sub-spacers that are spaced apart from each other.

A planar shape of the sub-spacer may include one of a circle, a regular polygon having five or more sides, and a regular polygon with at least one rounded corner and five or more sides.

The plurality of light emitting regions may be arranged in a first direction and a second direction, one spacer may be positioned for no more than two of the plurality of light emitting regions arranged in the first direction, and one spacer may be positioned for no more than two of the plurality of light emitting regions arranged in the second direction.

A manufacturing method of a display device according to an embodiment includes: forming a thin film transistor on a substrate; forming a plurality of pixel electrodes on the thin film transistor; forming an insulation layer including an organic material on the plurality of pixel electrodes and a plurality of spacers positioned on the insulation layer; disposing a mask including a plurality of openings on the plurality of spacers; and forming a plurality of emission layers in an opening of the insulation layer through the plurality of openings of the mask, wherein a shape of the spacer may be one of a circle, a regular polygon having five or more sides, or a regular polygon with at least one rounded corner and five or more sides. A planar area of the spacer may be larger than a planar area of a smallest light emitting region among the plurality of light emitting regions, and a number of the plurality of the spacers positioned in a predetermined region is at least 30% of a number of the plurality of the light emitting regions arranged in the predetermined region.

According to the embodiments, it is possible to form an organic layer evenly on the substrate by improving the spreadability of the ink layer dropped in the Inkjet process for forming the organic layer of the display device, and the strength against external pressure can be increased.

DETAILED DESCRIPTION OF THE EMBODIMENTS

Figure 1:
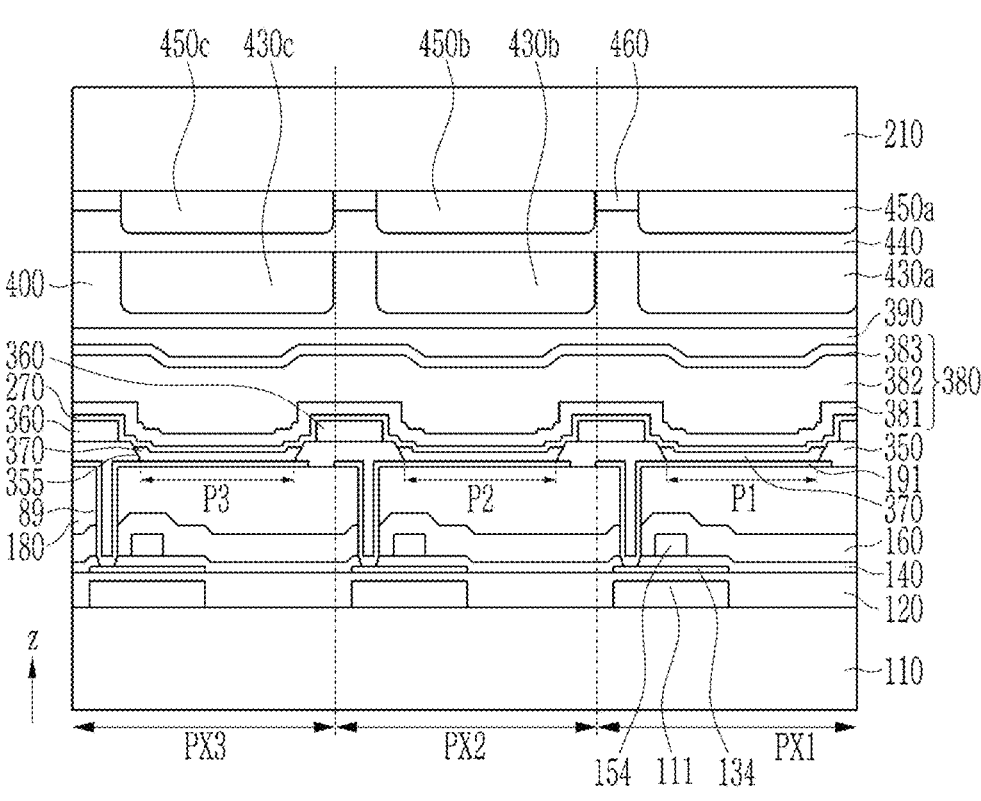
FIG. 1 is a cross-sectional view of a display device according to an embodiment.

Hereinafter, embodiments of the present invention will be described more fully with reference to the accompanying drawings, in which embodiments of the invention are shown. The inventive concept may be implemented in several different forms and is not limited to the embodiments described herein.

In order to clearly describe the disclosed concept, parts that are irrelevant to the description have been omitted, and like reference numerals designate like elements throughout the specification.

In the drawings, size and thickness of each element are arbitrarily illustrated for convenience of description, and the inventive concept is not necessarily limited to as illustrated in the drawings. In the drawings, the thickness of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean "at an upper side" indicating a direction that is opposite of the direction of gravity.

In addition, unless explicitly described to the contrary, the word "comprise", and variations such as "comprises" or "comprising", will be understood to imply the inclusion of stated elements but not the exclusion of any other elements. Further, throughout the specification, the phrase "on a plane" means viewing a target portion from the top, and the phrase "on a cross-section" means viewing a cross-section formed by vertically cutting a target portion from the side.

Referring to FIG. 1 to FIG. 10, a display device according to an embodiment will be described.

FIG. 1 is a cross-sectional view of a display device according to an embodiment.

Referring to FIG. 1, a display device according to an embodiment includes a display area where an image can be displayed, and the display area includes a plurality of pixels PX1, PX2, and PX3 which are units for displaying an image.

The display device may include a plurality of pixels PX1, PX2, and PX3 positioned on a substrate 110. The substrate 110 may include an insulating material such as glass or plastic, and may have flexibility.

A first conductive layer including a conductive pattern 111 and a plurality of signal lines and voltage lines may be positioned on the substrate 110. The first conductive layer may include a conductive metal or a semiconductor material having a conductive characteristic that is equivalent to that of the conductive metal.

A buffer layer 120, which is an insulation layer, may be positioned on the first conductive layer, and a plurality of active patterns 134 may be positioned on the buffer layer 120. The active pattern 134 may include a semiconductor material such as an oxide semiconductor such as amorphous silicon, polysilicon, or IGZO.

A first insulation layer 140 may be positioned on the active pattern 134, and a second conductive layer including a gate electrode 154 may be positioned on the first insulation layer 140. The active pattern 134 and the gate electrode 154 may form a thin film transistor together.

At least one of the first conductive layer and the second conductive layer may include at least one of metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), or alloys thereof.

A second insulation layer 160 may be positioned on the second conductive layer, and a third insulation layer 180 may be positioned on the second insulation layer 160.

At least one of the buffer layer 120, the second insulation layer 160, and the third insulation layer 180 contains an inorganic insulating material such as a silicon nitride ($SiN_x$), a silicon oxide ($SiO_x$), and a silicon oxynitride ($SiO_xN_y$), and/or organic insulating material.

The second insulation layer 160 may be omitted in some embodiments.

A third conductive layer including a plurality of pixel electrodes 191 may be positioned on the third insulation layer 180. The pixel electrode 191 may be electrically connected with a conductive area of the active pattern 134 through an opening 89 of the first insulation layer 140, the second insulation layer 160, and the third insulation layer 180.

The third conductive layer may contain either a semi-transparent conducting material or a reflective conducting material.

A fourth insulation layer 350 may be positioned on the third conductive layer. The fourth insulation layer 350 includes openings 355 that are respectively positioned on pixel electrodes 191 of the pixels PX1, PX2, and PX3.

The fourth insulation layer 350 may include an organic insulating material such as a photoresist, a polyacryl-based resin, a polyimide-based resin, an acryl-based resin, or a silicone compound.

An emission layer 370 is positioned on each pixel electrode 191. The emission layer 370 may include a portion positioned inside the opening 355 of the fourth insulation layer 350.

The emission layer 370 may include an organic light emitting material or an inorganic light emitting material.

The emission layers 370 positioned on the different pixels PX1, PX2, and PX3 may contain a light emitting material capable of emitting light of different colors, or may contain a light emitting material emitting a first color light, which may be blue light.

A plurality of spacers 360 are positioned on the fourth insulation layer 350. The spacer 360 may include the same material as the fourth insulation layer 350, but alternatively may include other organic materials. The fourth insulation layer 350 and the spacer 360 form two portions with different thicknesses through one photo process using an optical mask including at least two portions with different light transmittance, and a relatively thin fourth insulation layer 350 portion because there is no spacer 360 thereon, and a portion of the spacer 360 having a relatively thick thickness by overlapping the fourth insulation layer 350 and the spacer 360 may be formed, and the fourth insulation layer 350 and the spacer 360 may be sequentially formed through different photo processes.

The spacer 360 is not positioned inside the opening 355 of the fourth insulation layer 350. That is, the spacer 360 does not overlap the opening 355 in the xy plane.

A detailed feature of the spacer 360 according to one embodiment will be described in more detail later.

Figure 2:
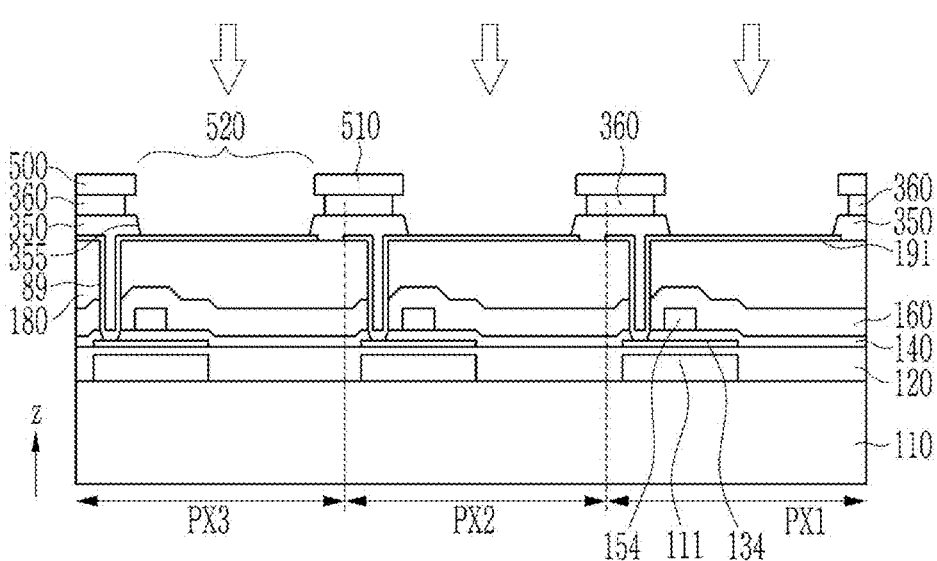
FIG. 2 is a cross-sectional view of a process of a manufacturing method of the display device according to the embodiment.

FIG. 2 is a cross-sectional view of a process of a manufacturing method of the display device according to the embodiment.

Referring to FIG. 2 together with FIG. 1, in a manufacturing method of the display device according to the embodiment, when the above-described constituent elements disposed on the substrate 110, that is, the thin film transistor, the plurality of pixel electrodes 191, the fourth insulation layer 350, and the spacer 360 are sequentially stacked and then the emission layer 370 of each of the pixels PX1, P2, and PX3 is formed, a plurality of openings 520 corresponding to the opening 355 of the fourth insulation layer 350 and a mask 500 including a blocking portion 510 may be used. The mask 500 may include, for example, a fine metal mask that includes the blocking portion 510 containing a metal. Through the opening 520 of the mask 500, a material of the emission layer 370 can be laminated into the opening 355.

In the process of forming the emission layer 370, the spacer 360 may serve to support the mask 500.

When the user uses the display device after the display device is completed, the spacer 360 may function to resist the pressure when the user applies external pressure to the display device. Therefore, when using the display device, it is possible to prevent damage to elements such as the emission layer 370 and the thin film transistor disposed below the emission layer 370, thereby increasing the strength of the display device against external pressure.

A common electrode 270 is positioned on the emission layer 370 and the spacer 360. The common electrode 270 may be continuously formed over the plurality of pixels PX1, PX2, and PX3. The common electrode 270 may include a conductive transparent material.

Each pixel electrode 191, the emission layer 370, and the common electrode 270 together form a light emitting diode, and one of the pixel electrode 191 and the common electrode 270 becomes a cathode and the other becomes an anode.

A region in which the opening 355 of the fourth insulation layer 350 is positioned may define light emitting regions P1, P2, and P3 of the respective pixels PX1, PX2, and PX3.

FIG. 3, FIG. 4, FIG. 5, and FIG. 6 are top plan views of a display area of a display device according to an embodiment.

FIG. 3 to FIG. 6 illustrate alignments of a plurality of light emitting regions P1, P2, and P3 on a xy plane, as an example. A plurality of light emitting regions P1, P2, and P3 according to an embodiment may include a first light emitting region P1 of a first pixel PX1, a second light emitting region P2 of a second pixel PX2, and a third light emitting region P3 of a third pixel PX3. The first light emitting region P1, the second light emitting region P2, and the third light emitting region P3 may emit light of different colors. For example, the first light emitting region P1 may emit red, the second light emitting region P2 may emit green, and the third light emitting region P3 may emit blue, but are not limited thereto. In the present description, unless otherwise described, embodiments in which the first light emitting region P1 emits red light, the second light emitting region P2 emits green light, and the third light emitting region P3 emits blue light will be mainly described.

According to an embodiment, the first light emitting region P1 and the third light emitting region P3 may be alternately arranged in an x direction and a y direction, the first light emitting region P1 and the second light emitting region P2 may be alternately arranged in one diagonal direction that is oblique to the x direction and the y direction, and the second light emitting region P2 and the third light emitting region P3 may be alternately arranged in another oblique direction. However, the arrangement of the plurality of light emitting regions including the first light emitting region P1, the second light emitting region P2, and the third light emitting region P3 is not limited thereto.

At least two of the first light emitting region P1, the second light emitting region P2, and the third light emitting region P3 may be different from each other in size on the xy plane. Referring to FIG. 3 to FIG. 6, the area on the xy plane of the second light emitting region P2 may be the smallest, and the area on the xy plane of the third light emitting region P3 may be the largest, but are not limited thereto.

An encapsulation layer 380 including a plurality of insulation layers 381, 382, and 383 may be positioned on the common electrode 270. The insulation layer 381 and the insulation layer 382 may include an inorganic insulating material, and the insulation layer 382 positioned between the insulation layer 381 and the insulation layer 382 may include an organic insulating material.

When the insulation layer 382 is formed in the manufacturing method of the display device according to the embodiment, it may be formed using an inkjet process, which entails dropping or depositing ink for an organic insulating material on the surface of the substrate 110 in several places and spreading the liquid ink.

A filling layer 390 including a filler may be positioned on the encapsulation layer 380. A cover layer 400 including an insulating material, and a plurality of color conversion layers 430a and 430b and a transmission layer 430c, may be positioned on the filling layer 390.

The transmission layer 430c may transmit incident light. That is, the transmission layer 430c may transmit a first color light that may be blue light. The transmission layer 430c may include a polymer material that transmits the first color light. A region in which the transmission layer 430c is positioned may correspond to a light emitting region emitting blue, and the transmission layer 430c may pass an incident first color light as it is without including a separate semiconductor nanocrystal.

The color conversion layers 430a and 430b may include different semiconductor nanocrystals. For example, the first color light incident on the color conversion layer 430a may be converted into a second color light and emitted by a semiconductor nanocrystal included in the color conversion layer 430b. The first color light incident on the color conversion layer 430b may be converted into a third color light and emitted by the semiconductor nanocrystal included in the color conversion layer 430b.

The semiconductor nanocrystal may include at least one of a phosphor and a quantum dot material that converts the incident first color light into the second color light or the third color light.

An insulation layer 440 may be positioned on the plurality of color conversion layers 430a and 430b and the transmission layer 430c, and a plurality of color filters 450a, 450b, and 450c and a light blocking member 460 may be positioned on the insulation layer 440.

The color filter 450a may represent the second color light, the color filter 450b may represent the third color light, and the color filter 450c may represent the first color light.

The substrate 210 may be positioned on the plurality of color filters 450a, 450b, and 450c and the light blocking member 460.

According to another embodiment of the present invention, instead of including a plurality of color conversion layers 430a and 430b and a transmission layer 430c, the emission layer 370 may include quantum dots.

Referring to FIGS. 7A, 7B, 7C, 7D, 7E, 8A, 8B, 8C, 8D, 8E, 9A, 9B, 10A, and 10B together with FIG. 3 to FIG. 6, the spacer 360 according to the embodiment will be described in detail.

Figures 7A, 7B, 7C, 7D, 7E:
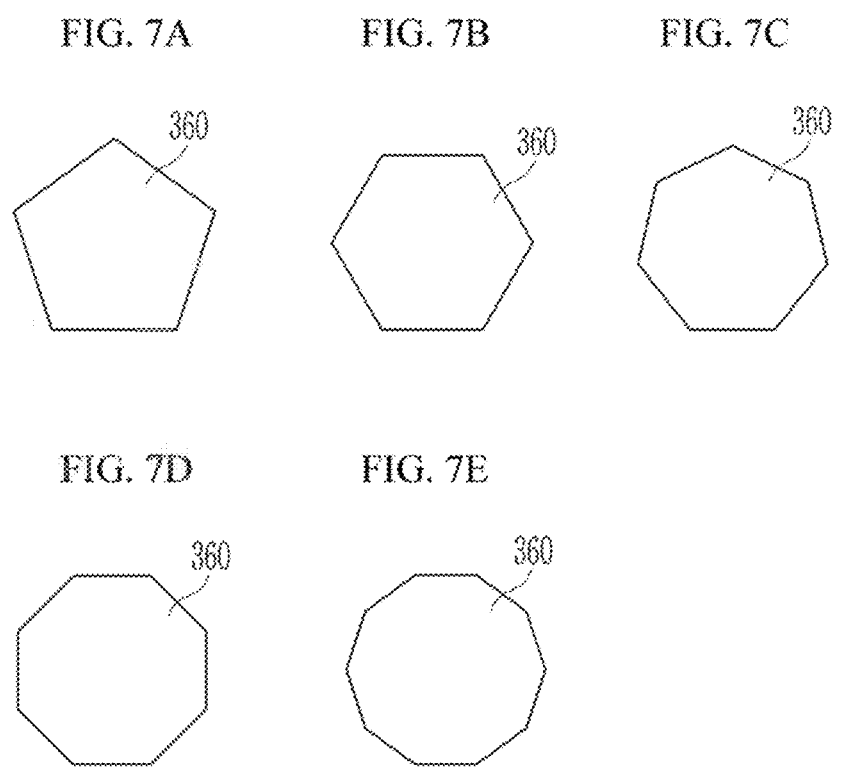

FIGS. 7A, 7B, 7C, 7D, 7E (collectively "FIG. 7"), FIGS. 8A, 8B, 8C, 8D, 8E (collectively "FIG. 8"), FIGS. 9A, 9B (collectively "FIG. 9"), and FIGS. 10A and 10B (collectively "FIG. 10") illustrate examples of planar shapes of a spacer included in a display device according to an embodiment.

The shape of the spacer 360 on the xy plane according to one embodiment is one of a circle, a regular polygon having five or more sides, or a regular polygon with at least one rounded corner and five or more sides. This will be described in detail hereinafter.

Referring to FIG. 7, the xy plane shape of the spacer 360 according to one embodiment may be a regular polygon having five or more sides. FIG. 7 shows an example in which the shape of the spacer 360 in the xy plane is a regular pentagon, a regular hexagon, a regular heptagon, a regular octagon, or a regular decagon. Although it is not shown, the shape of the spacer 360 may include a regular nonagon.

Referring to FIG. 8, the shape of the spacer 360 in the xy plane according to one embodiment may be a regular polygon that has five or more sides, with at least one corner rounded.

Although FIG. 8 illustrates a shape in which all corners included in each of a regular pentagon, a regular hexagon, a regular heptagon, a regular octagon, or a regular decagon are rounded, these are just examples and fewer than all corners may be rounded.

Referring to FIG. 9, the shape of spacer 360 in the xy plane according to an embodiment may be circular. It may be understood that a circle is a polygon having an infinite number of sides.

FIG. 9 also illustrates an embodiment of the spacer 360 in which quadrants (quarter circles) are positioned at each of the four corners of a square, as viewed in the xy plane.

Referring to FIG. 10, the shape of the spacer 360 in the xy plane according to an embodiment may have a shape in which a quadrant forms at least two of four corners of an approximately square or rectangular shape, and the other corners have a rounded shape rather than being a quadrant.

As shown in the right side in FIG. 10, the shape of the spacer 360 in the xy plane according to an embodiment may be a cross in which all corners are rounded.

Referring back to FIG. 3 to FIG. 6, when being viewed on the xy plane, an area of each spacer 360 is larger than an area of a light emitting region having the smallest area among the first light emitting region P1, the second light emitting region P2, and the third light emitting region P3, for example, the second light emitting region P2.

The number of the spacers 360 in the predetermined region of the xy plane may be 30% or more of the total number of the combined number of light emitting regions P1, P2, and P3 in the predetermined region. For example, when 100 light emitting regions P1, P2, and P3 are arranged in a predetermined region, 30 or more spacers 360 may be arranged in the same predetermined region.

The spacer 360 according to the embodiment may satisfy the conditions of 1) having a flat shape such as a circle, 2) having an area larger than the smallest light emitting region, and 3) being present in a number that is 30% or more of the combined the number of light emitting regions P1, P2, and P3. When these three conditions are met, the ink layer flows and spreads out better on the surface it is on, and capillary force helps to form a continuous, even layer to achieve improved lamination of the upper organic layer using the inkjet coating process.

The plurality of spacers 360 are disposed at a preset interval in the x direction and/or the y direction.

A width of each spacer 360 in the x direction or y direction (diameter, or the widest distance within the shape) may be at least 50% of a distance between two adjacent light emitting regions P1, P2, and P3 in the x direction or y direction. The "distance between two adjacent light emitting regions" is intended to mean the distance between two closest edges of the adjacent light emitting regions. Specifically, the widths (diameter when the spacer is a circle, the widest distance within the shape in other cases) of the respective spacers 360 in the x and y directions may be 50% or more of a distance between two second light emitting regions P2 neighboring in the x direction or y direction. In particular, the width of each spacer 360 in the x direction or y direction (diameter when the spacer is a circle) may be 50% or more of a distance between two neighboring regions of the smallest size (e.g., the second light emitting region P2 in the examples shown in FIG. 3 through FIG. 6) among a plurality of light emitting regions P1, P2, and P3 when the two smallest light emitting regions neighbor each other in the x direction or y direction.

With the spacers 360 being arranged and sized to fulfill the conditions described above, the spreadability of the ink layer can be improved by increasing the ink flow continuity and capillary force when an organic layer on the upper portion of the spacer 360 is laminated by the inkjet coating process.

FIG. 3 to FIG. 6 illustrate examples of the arrangement of the spacers 360 that satisfy all the above-stated conditions. For simplicity, the arrangements of light emitting regions P1, P2, and P3 will be described in terms of rows that extend in the x-direction and the columns that extend in the y-direction.

According to an embodiment (e.g., embodiments of FIG. 5 and FIG. 6), when a plurality of light emitting regions P1, P2, and P3 are arranged in the x direction and y direction, one spacer 360 may be positioned in every one or two of a plurality of light emitting regions P1, P2, and P3 arranged in the x direction, and one spacer 360 may be positioned in every one or two of a plurality of light emitting regions P1, P2, and P3 arranged in the y direction. The spacers 360 are spaced close enough to cause capillary force therebetween, and thus the spreadability of the ink layer can be improved by using the increased ink flow continuity and capillary force when an organic layer on the upper portion of the spacer 360 is laminated by the inkjet coating process.

Figure 3:
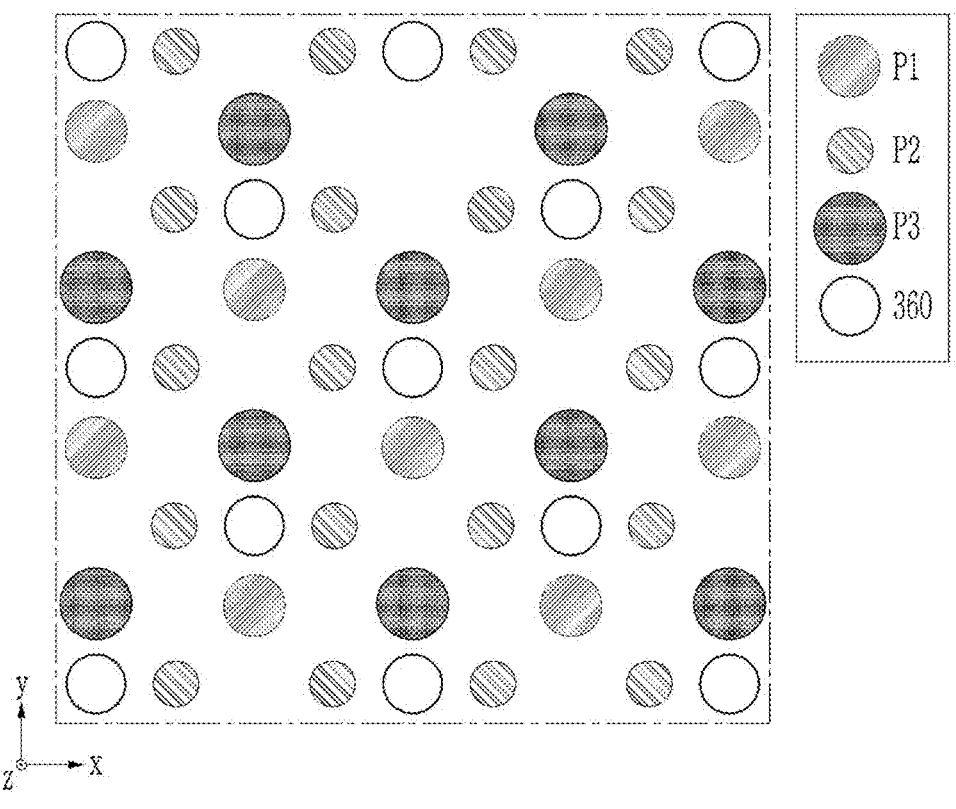
FIG. 3, FIG. 4, FIG. 5 and FIG. 6 are top plan views of a display area of a display device according to an embodiment, FIGS. 7A, 7B, 7C, 7D, 7E, 8A, 8B, 8C, 8D, 8E, 9A, 9B, 10A, and 10B respectively illustrate examples of planar shapes of a spacer included in a display device according to an embodiment.

FIG. 3 illustrates an embodiment in which one spacer 360 for every two second light emitting regions P2 in the x direction is positioned in a row that has the second light emitting region P2 arranged in the x direction, one spacer 360 for every two first or third light emitting regions P1 and P3 in the y direction in a column that has first or third light emitting regions P1 and P3 arranged in the y direction. In this embodiment, no spacer 360 is positioned between second light emitting regions P2 arranged in the y direction or in rows that do not have the second light emitting region P2.

Figure 4:
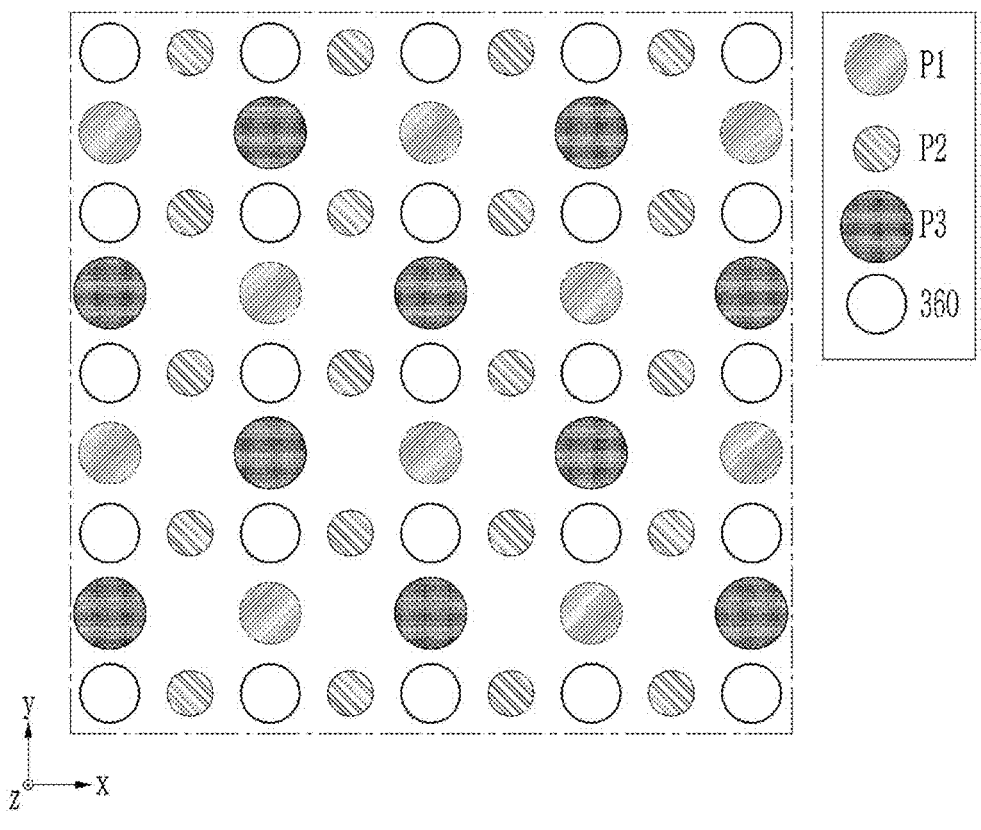

FIG. 4 illustrates an embodiment in which a spacer 360 is positioned between two neighboring light emitting regions in the y-direction. More specifically, a spacer 360 is positioned between a first light emitting region P1 and a third light emitting region P3 neighboring each other in the y direction. In the x direction, a spacer 360 is positioned between second light emitting regions P2 neighboring in the x direction, but no spacer 360 is positioned between a first light emitting region P1 and a third light emitting region P3 neighboring in the x direction and second light emitting regions P2 neighboring in the y direction. In the particular embodiment, this results in the spacers 360 being in every other row extending in the x direction. Compared to the embodiment shown in FIG. 3, the embodiment of FIG. 4 has about twice as many spacers 360 in a given area.

Figure 5:
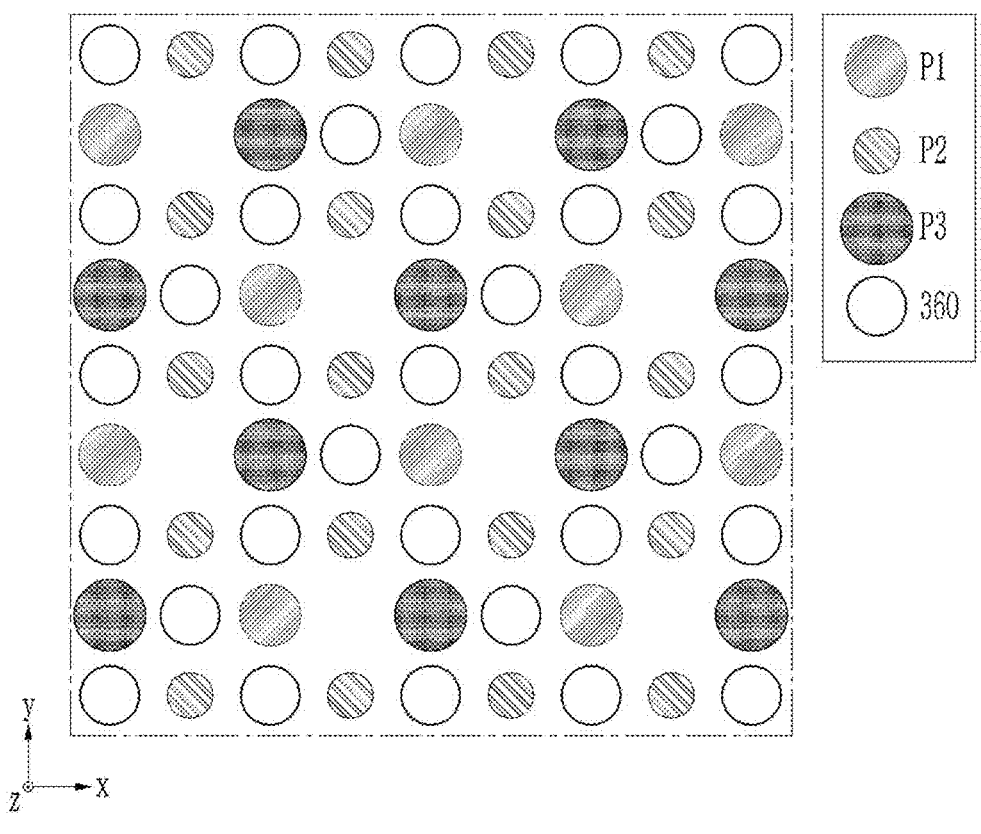
Figure 6:
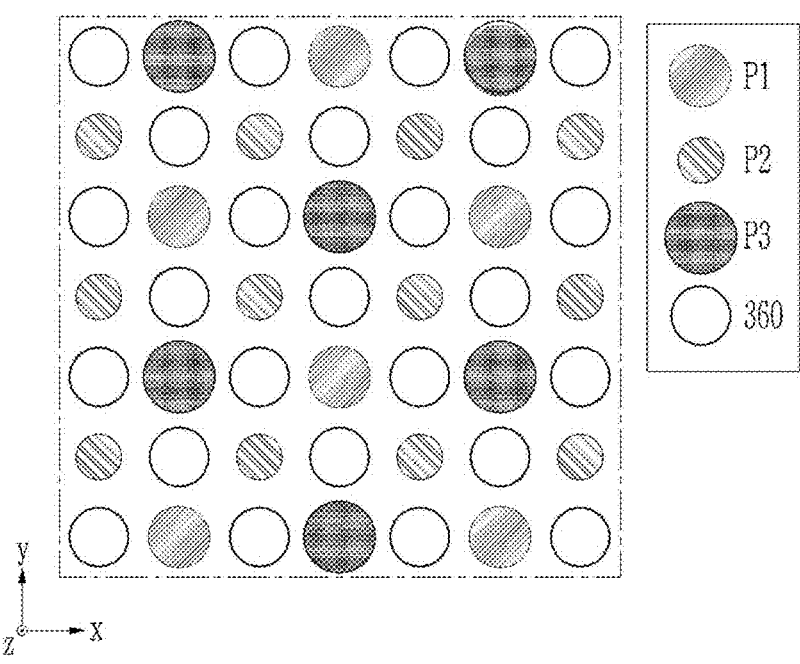
Figure 9A:
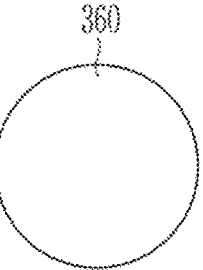
Figure 9B:
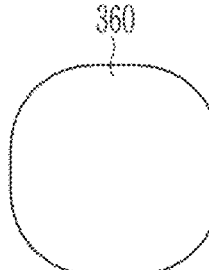

Embodiments shown in FIG. 5 and FIG. 6 are similar to the embodiment shown in FIG. 4, except that a spacer 360 may be additionally positioned between a first light emitting region P1 and a third light emitting region P3 neighboring in the x direction or second light emitting regions P2 neighboring in the y direction.

In the embodiment shown in FIG. 5, one spacer 360 may be positioned after every two light emitting regions in the x direction, in this case the first or third light emitting regions P1 or P3 arranged in the x direction. The spacer 360 is positioned every light emitting region in alternating rows, which may be rows that have the second light emitting regions P2. In the y direction, one spacer 360 may be positioned every two second light emitting regions P2 in the columns that have the second light emitting regions P2. In the columns that have the first and third light emitting regions P1 and P3, the spacer 360 is positioned after every light emitting region.

In the embodiment shown in FIG. 6, a spacer 360 may be positioned between every neighboring light emitting region in every row and every column. More specifically, a spacer is positioned between the first light emitting region P1 and the third light emitting region P3 neighboring in the x direction and the y direction, and a spacer 360 may be positioned between all of the second light emitting regions P2 neighboring in the x direction and the y direction. In the embodiment shown in FIG. 6, the spacer 360 may be positioned between the light emitting regions P1, P2, and P3 neighboring in all of the x direction, the y direction, and the diagonal direction.

Figure 11:
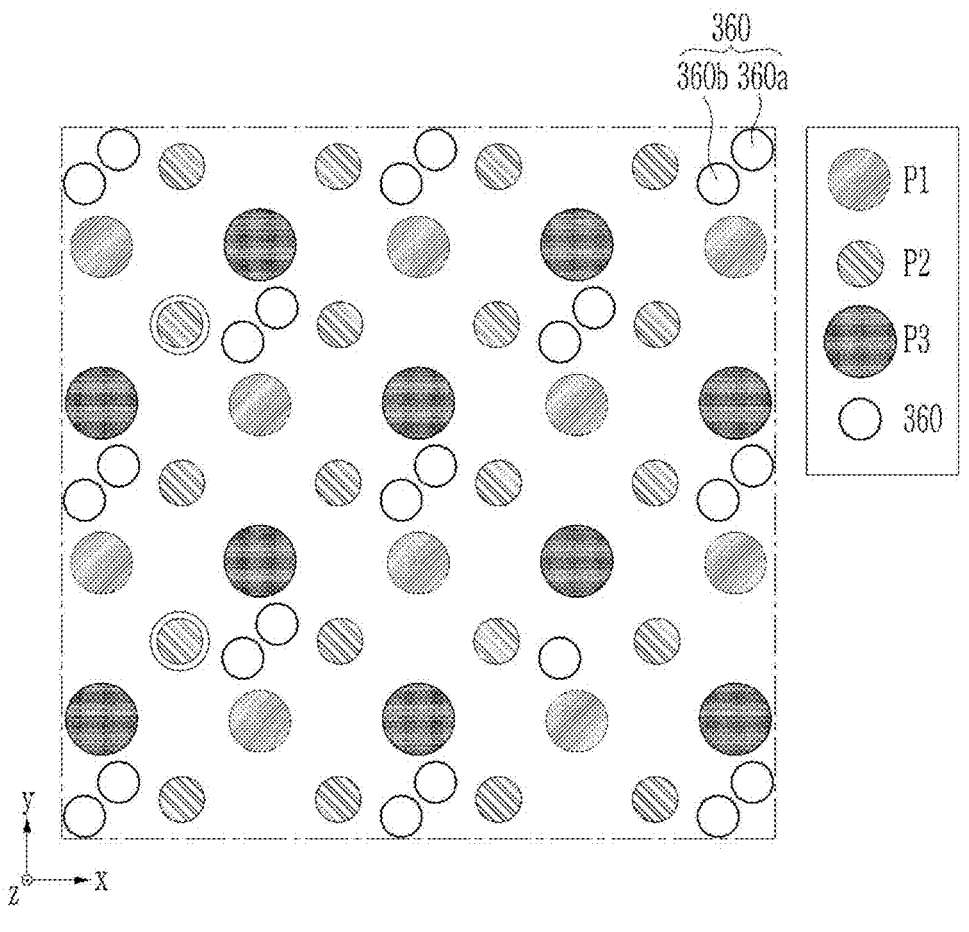
FIG. 11 is a top plan view of a display area of a display device according to an embodiment.

Referring to FIG. 11 together with the above-described drawings, a display device according to an embodiment will be described.

FIG. 11 is a top plan view of a display area of a display device according to an embodiment.

Referring to FIG. 11, a display device according to an embodiment is almost the same as the display device according to the embodiments of FIGS. 3, 4, 5, and 6, except that "one" spacer 360 may include two or more sub-spacers 360*a* and 360*b* spaced apart from each other. FIG. 11 shows an example in which the arrangement of light emitting regions P1, P2, P3 and spacers 360 are similar to that of FIG. 3, except that each spacer 360 includes two spaced sub-spacers 360*a* and 360*b*. the exact number of sub-spacers 360*a* and 360*b* is not limited to two per spacer 360 (e.g., there may be more than two sub-spacers that make up a spacer 360).

The arrangement shape and direction of a plurality of sub-spacers 360*a* and 360*b* included in one spacer 360 may be varied. When one spacer 360 includes two sub-spacers 360a and 360b, as shown in FIG. 11, the two sub-spacers 360a and 360b may be arranged in a diagonal direction that is oblique to the x direction and the y direction. When one spacer 360 includes three or more sub-spacers 360a and 360b, three or more sub-spacers 360a and 360b may be arranged at the edges of an imaginary regular polygon.

The shape of each of the sub-spacers 360a and 360b in the xy plane may be the same as the shape of each spacer 360 described above in FIG. 7 to FIG. 10. That is, each of the sub-spacers 360a and 360b on the xy plane may include one of a circular shape, a pentagonal or more regular polygon, or a regular polygon having at least one rounded corner of a pentagonal or more regular polygon.

Next, referring to FIG. 12 to FIG. 18 together with the above-described drawings, the effect of the display device according to the embodiment will be described in comparison with a display device according to a comparative example.

Figure 12:
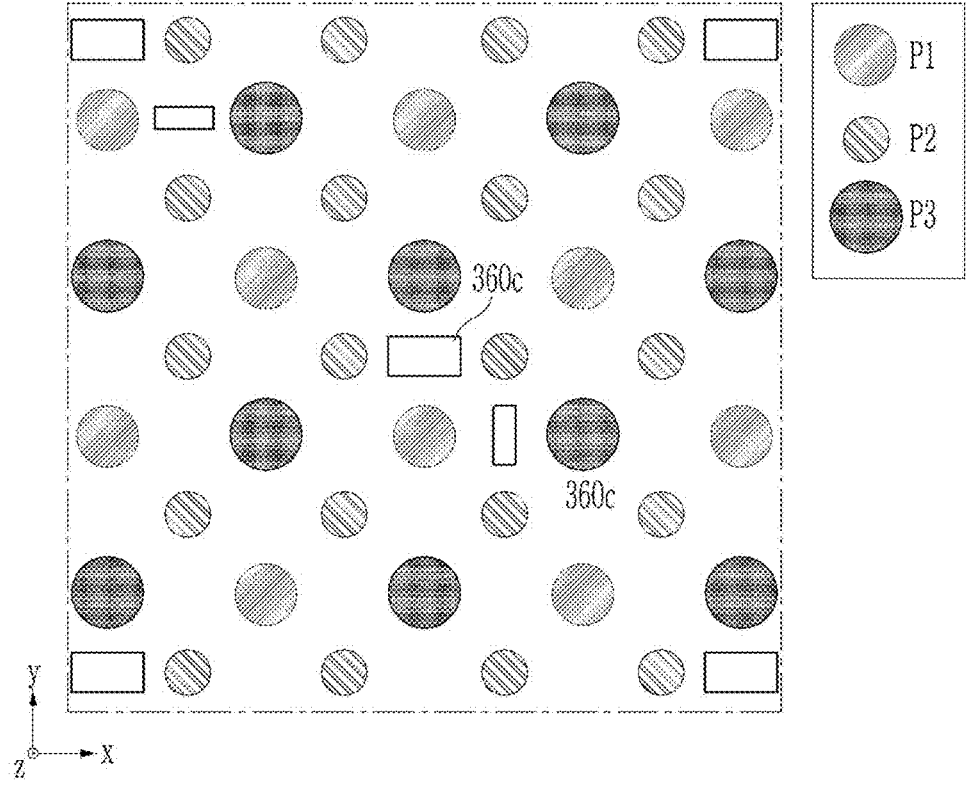
FIG. 12 is a top plan view of a display area of a display device according to a comparative example.
Figure 13:
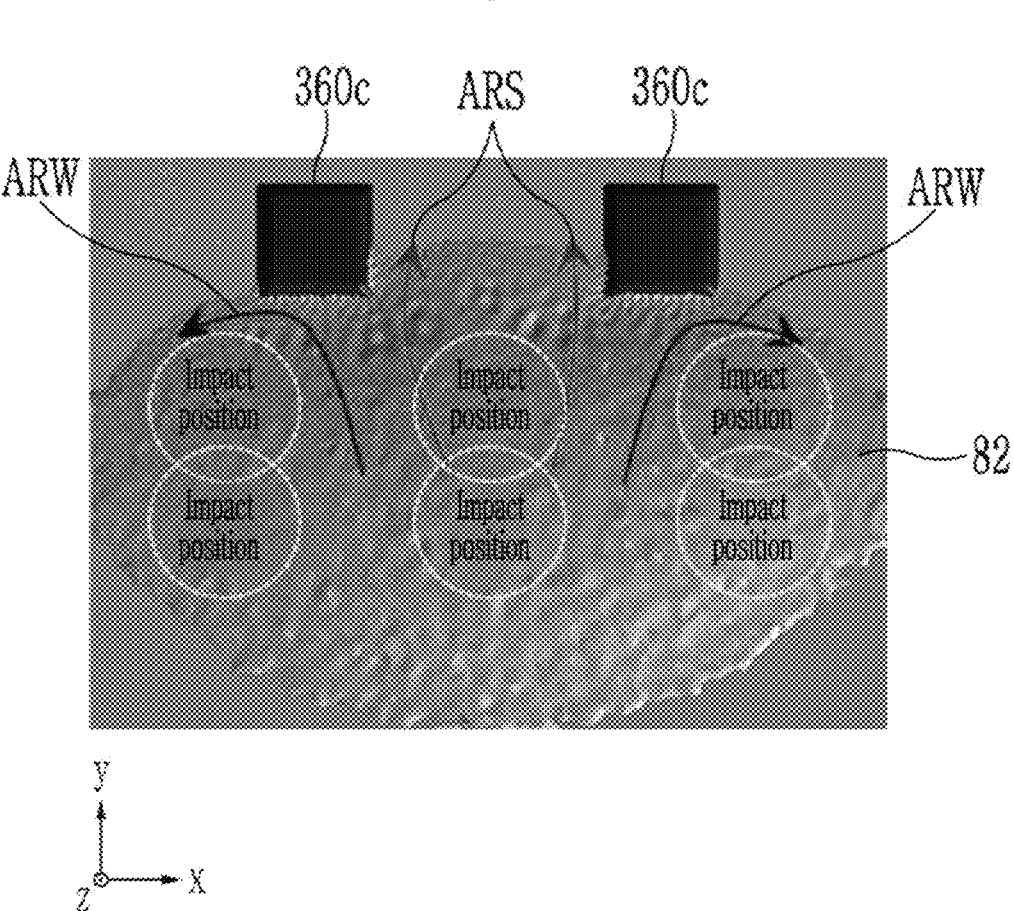
FIG. 13 and FIG. 14 show movement of ink dropped at the periphery of a spacer according to the comparative example.
Figure 14:
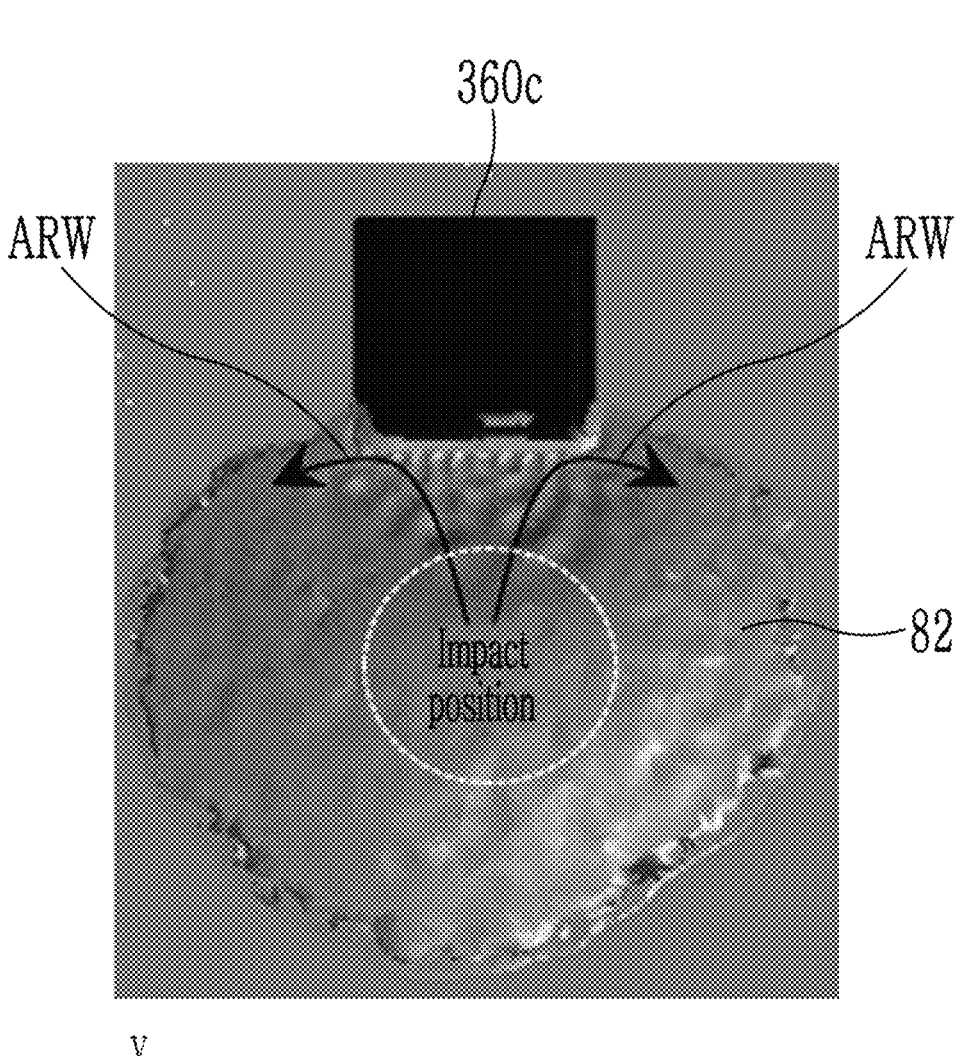
Figure 14:
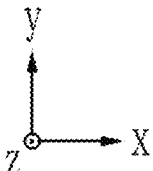
Figure 15:
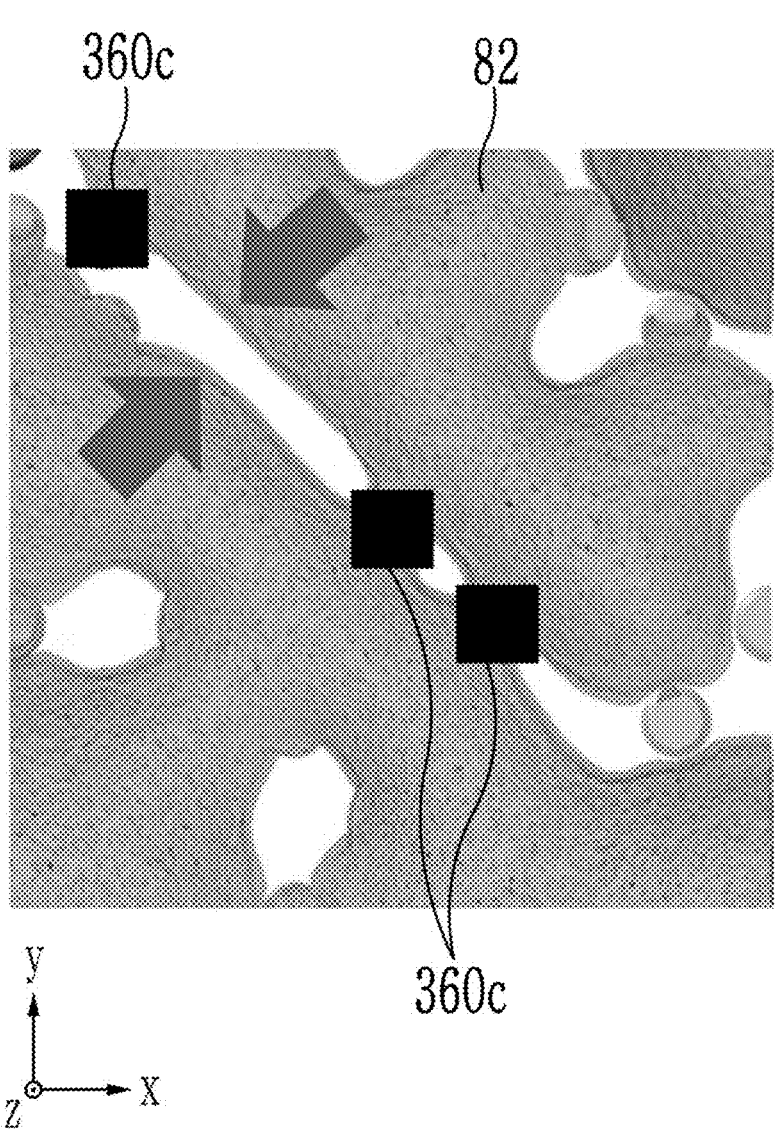
FIG. 15 is a figure showing spreadability of the dropped ink in a manufacturing process of the display device according to the comparative example.

FIG. 12 is a top plan view of a display area of a display device according to a comparative example, FIG. 13 and FIG. 14 show movement of ink dropped at the periphery of a spacer according to the comparative example, and FIG. 15 is a figure showing spreadability of the dropped ink in a manufacturing process of the display device according to the comparative example.

FIG. 12 to FIG. 15 depict display devices according to the conventional or comparative examples, not display devices according to the embodiments of the disclosure. More specifically, the display devices of FIGS. 12, 13, 14, and 15 may include a spacer 360c that does not satisfy the planar shape, the area condition, the width range in the x direction or the y direction, and the equal spacing condition in the x direction or the y direction of the spacer 360 described with reference to FIG. 1 to FIG. 11.

A spacer 360c included in the display device according to the conventional or comparative example shown in FIG. 12 has a rectangular shape with sharp corners and is longer in the x direction or the y direction, and is not arranged at equal intervals in the x direction or the y direction.

A spacer 360c included in the display device according to the conventional or comparative example shown in FIG. 13 to FIG. 15 has a square shape with sharp corners, and is not arranged at equal intervals in the x direction or the y direction.

When a manufacturing method of a display device according to a conventional or comparative example includes forming an organic layer positioned on a substrate where a spacer 360c is formed using an inkjet process, the continuity of the flow of a dropped or spotted ink layer is cut off around the spacer 360c, making it difficult to spread evenly.

Referring to FIG. 13 and FIG. 14, an ink layer 82 is formed and spread by dropping ink on a plurality of impact positions on the upper portion as indicated, near where the spacer 360c is formed. Some of the ink spreads as shown by the arrow ARS between adjacent spacers 360c. The ink that flows toward the spacer 360c may be diverted as shown by the arrow ARW.

FIG. 14, confirms that the ink layer 82 does not spread too far from the impact position and in fact, stagnates soon after reaching the spacer 360c, as shown by the arrow ARW. This stagnation is because the ink layer 82 is blocked by the sharp corners of the spacer 360c.

FIG. 15 shows that when the spread of the ink layer 82 is disturbed, the ink layer 82 on the upper portion of the substrate does not spread evenly, and as shown by the arrow in FIG. 14, there are many regions that are not covered with ink. When spacers 360c deviate from the above-described conditions of spacer 360 according to the present embodiment, the capillary action between a spacer 360c and an adjacent spacer 360c is not activated and thus the spreadability of the ink layer 82 is weak.

Figure 16:
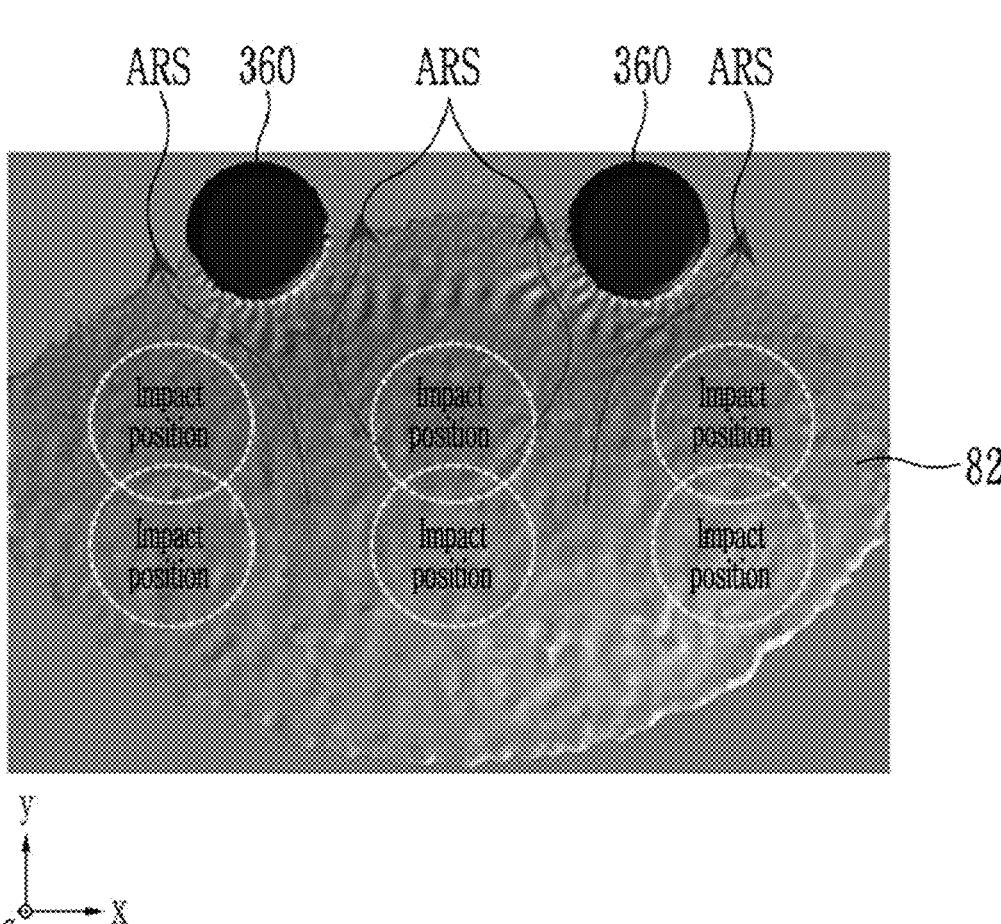
FIG. 16 and FIG. 17 show movement of ink dropped at the periphery of the spacer according to the embodiment.
Figure 17:
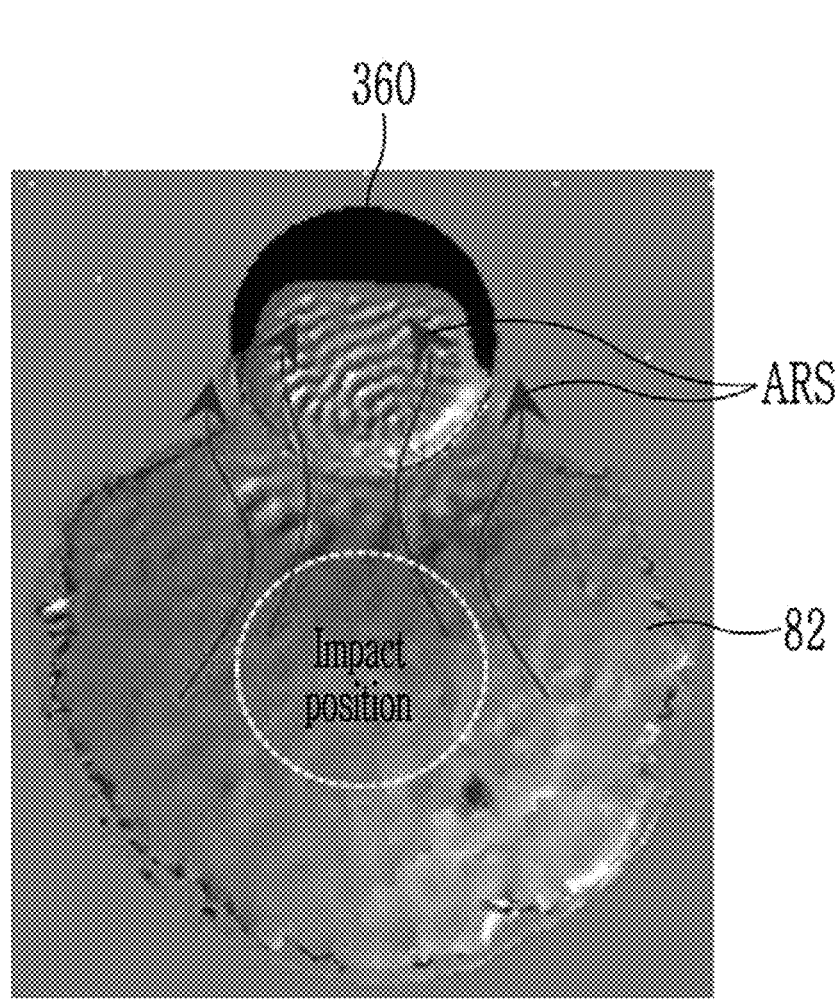
Figure 17:
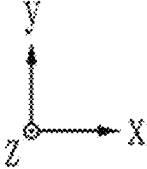
Figure 18:
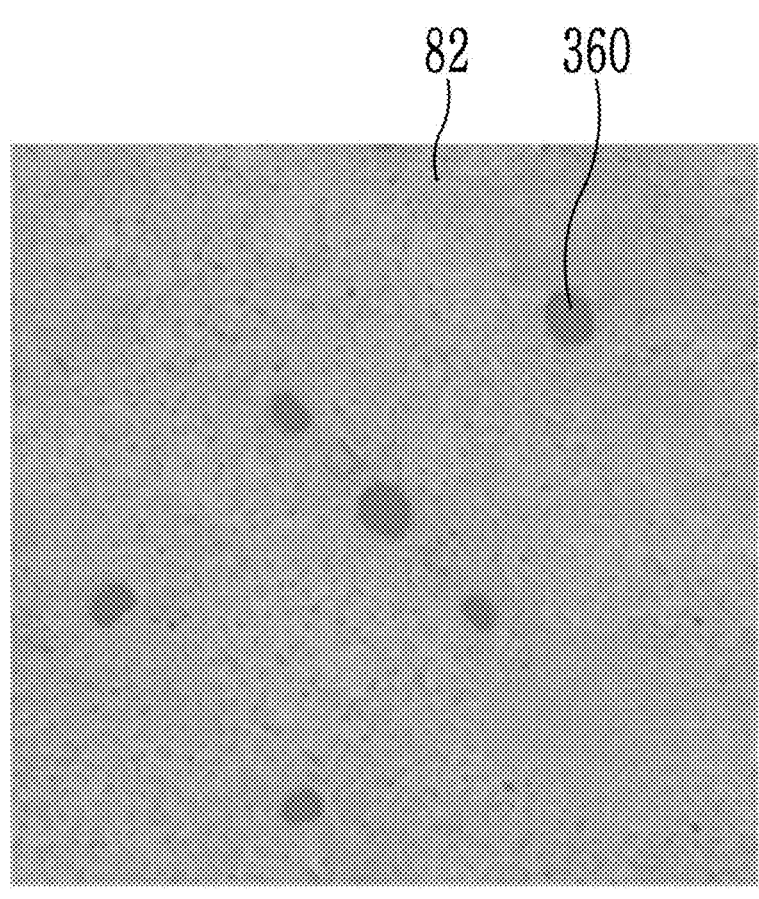
FIG. 18 shows the spreadability of the ink dropped in a manufacturing process of the display device according to the embodiment.
Figure 18:
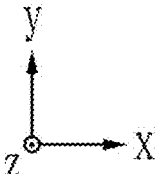

FIG. 16 and FIG. 17 show movement of ink dropped at the periphery of the spacer according to the embodiment, and FIG. 18 shows the spreadability of the ink dropped in a manufacturing process of the display device according to the embodiment.

In the manufacturing method of the display device including the spacer 360 according to the present embodiment, the organic layer positioned on the substrate 110 on which the spacer 360 is formed, for example, the insulation layer 382 of the encapsulation layer 380, can be formed using an inkjet process. Compared with the conventional or comparative example described above, the continuity of the flow of ink dropped around the spacer 360 according to the present embodiment continues, and thus it can easily form an insulation layer 382 evenly throughout the substrate 110 where the ink layer spreads evenly throughout the substrate 110.

Referring to FIG. 16 and FIG. 17, the ink layer 82 is formed by dropping ink on a plurality of impact positions on the portion of the substrate near the spacer 360. and the ink flows toward an adjacent spacer 360, may spread out while passing through the spacer 360 as shown by the arrow ARS by the capillary force between the spacers 360 that are not spaced too far apart, according to the condition of the present embodiment. Due to the shape of the spacer 360 in the form of a circle or regular polygon, the tension on the spacer 360 of the ink layer 82 passing around the spacer 360 acts to continuously flow around the spacer 360 are as indicated by the arrows ARS.

Referring to FIG. 17, due to the shape of spacer 360, the ink layer 82 can easily climb the spacer 360 and spread as indicated by the arrow ARS. The ink layer 82 spreads around the spacer 360c to form a continuous layer.

FIG. 18 shows that, due to the improved spreadability of the ink layer 82, the ink layer 82 on the upper portion of the substrate spreads evenly, and most regions are covered with the ink layer 82 except for some regions on top of the spacer 360.

Figure 19:
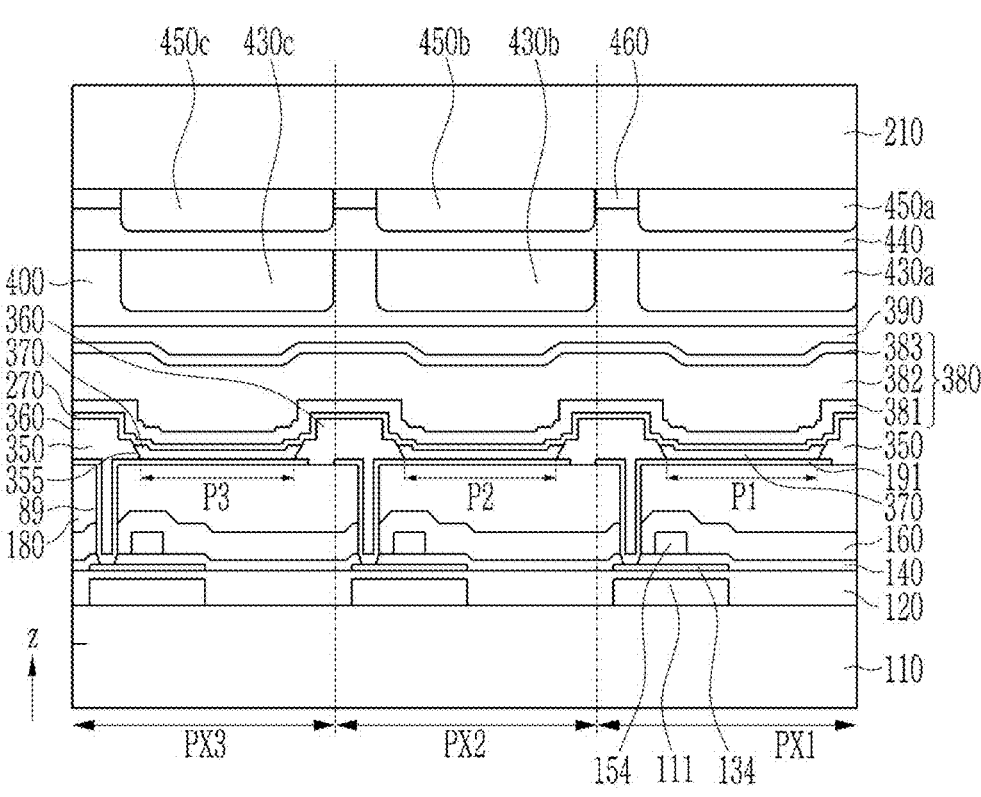
FIG. 19 is a cross-sectional view of a display device according to an embodiment.

FIG. 19 is a cross-sectional view of a display device according to an embodiment.

Referring to FIG. 19, a display device according to an embodiment is almost the same as the display device according to the above-described embodiment, except that a fourth insulation layer 350 and a spacer 360 positioned on the fourth insulation layer 350 are formed of the same material through one photo process. As previously described, an organic insulation material layer having photosensitivity is formed on a substrate 110 where a pixel electrode 191 is formed, and then two portions with different thicknesses may be formed through a photo process using a photomask that includes at least two portions with different light transmittance. Accordingly, a relatively thin portion of the thin fourth insulation layer 350 can be formed since there is no spacer 360 on an upper portion, and a relatively thick portion of the spacer 360 may be formed since the fourth insulation layer 350 and the spacer 360 overlap.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:

a substrate;

an insulation layer that is positioned on the substrate and includes a plurality of openings;

a plurality of emission layers that are positioned in the openings; and a plurality of spacers that are positioned on the insulation layer, wherein an area where the plurality of emission layers are positioned defines a plurality of light emitting regions in a plan view, in the plan view, at least one of the spacers has a shape of a circle, a regular polygon having five or more sides, or a regular polygon with five or more sides and at least one rounded corner, a planar area of at least one of the spacers is larger than a planar area of a smallest light emitting region among the plurality of light emitting regions in the plan view, and a number of the plurality of the spacers positioned in a predetermined region in the plan view is at least 30% of a number of the plurality of the light emitting regions arranged in the same predetermined region in the plan view.

2. The display device of claim 1, wherein a width of the plurality of spacers in a first direction in the plan view is 50% or more of a distance between two light emitting regions that are neighboring in the first direction.

3. The display device of claim 2, wherein a width of the plurality of spacers in a second direction that is perpendicular to the first direction in the plan view is 50% or more of the distance between two light emitting regions that are neighbored in the second direction.

4. The display device of claim 3, wherein the plurality of spacers are disposed at a preset interval in at least one of the first direction and the second direction in the plan view.

5. The display device of claim 1, wherein one spacer is positioned between two light emitting regions that neighbor each other in one direction in the plan view.

6. The display device of claim 1, wherein the spacer comprises a plurality of sub-spacers that are spaced apart from each other in the plan view.

7. The display device of claim 6, wherein a planar shape of the sub-spacer includes one of a circle, a regular polygon having five or more sides, and a regular polygon with at least one rounded corner and five or more sides in the plan view.

8. The display device of claim 1, wherein the plurality of light emitting regions are arranged in a first direction and a second direction in the plan view, the spacers are positioned one for every one or two of the plurality of light emitting regions arranged in the first direction, and the spacers are positioned one for every one or two of the plurality of light emitting regions arranged in the second direction.

9. The display device of claim 1, wherein the insulation layer and the spacer include a same material.

10. The display device of claim 1, wherein the insulation layer and the spacer include different materials from each other.

11. The display device of claim 1, further comprising:

a pixel electrode that is positioned between the substrate and the insulation layer; and a common electrode that is positioned on the emission layer, wherein the pixel electrode, the emission layer, and the common electrode together form a light emitting diode.

12. The display device of claim 11, further comprising an organic layer that is positioned on the light emitting diode and coated on an entire surface of the substrate.

13. A display device comprising:

a substrate;

an insulation layer that is positioned on the substrate and includes a plurality of openings;

a plurality of emission layers that are positioned in the openings; and a plurality of spacers that are positioned on the insulation layer, wherein an area where the plurality of emission layers are positioned defines a plurality of light emitting regions on a plane in a plan view, in the plan view, at least one of the spacers has a shape of a regular polygon having five or more sides, or a regular polygon with at least one rounded corner and five or more sides, and a number of the plurality of the spacers positioned in a predetermined region in the plan view is at least 30% of a number of the plurality of the light emitting regions arranged in the same predetermined region in the plan view.

14. The display device of claim 13, wherein a width of the plurality of spacers in a first direction in the plan view is 50% or more of a distance between two light emitting regions that are neighboring in the first direction.

15. The display device of claim 14, wherein a width of the plurality of spacers in a second direction that is perpendicular to the first direction in the plan view is 50% or more of a distance between two light emitting regions that are neighbored in the second direction.

16. The display device of claim 15, wherein the plurality of spacers are disposed at a preset interval in at least one of the first direction and the second direction in the plan view.

17. The display device of claim 13, wherein the spacer comprises a plurality of sub-spacers that are spaced apart from each other in the plan view.

18. The display device of claim 17, wherein a planar shape of the sub-spacer includes one of a circle, a regular polygon having five or more sides, and a regular polygon with at least one rounded corner and five or more sides.

19. The display device of claim 13, wherein the plurality of light emitting regions are arranged in a first direction and a second direction in the plan view, the spacers are positioned one for every one or two of the plurality of light emitting regions arranged in the first direction, and the spacers are positioned one for every one or two of the plurality of light emitting regions arranged in the second direction.

* * * * *